(12) United States Patent
Angelini

(10) Patent No.: US 11,946,958 B2
(45) Date of Patent: Apr. 2, 2024

(54) CURRENT SENSING CIRCUIT

(71) Applicant: STMicroelectronics S.r.l., Agrate Brianza (IT)

(72) Inventor: Paolo Angelini, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 39 days.

(21) Appl. No.: 17/655,891

(22) Filed: Mar. 22, 2022

(65) Prior Publication Data

US 2022/0357375 A1    Nov. 10, 2022

(30) Foreign Application Priority Data

Apr. 28, 2021    (IT) ........................ 102021000010766

(51) Int. Cl.
*G01R 19/25*    (2006.01)
*G01R 15/14*    (2006.01)

(52) U.S. Cl.
CPC ........... *G01R 19/25* (2013.01); *G01R 15/146* (2013.01)

(58) Field of Classification Search
CPC ... G01R 19/25; G01R 15/146; G01R 19/0092
USPC ......................................................... 324/713
See application file for complete search history.

(56) References Cited

U.S. PATENT DOCUMENTS

2006/0097731 A1* 5/2006 Taylor ................ G01R 19/0092
324/609

2019/0379270 A1* 12/2019 Pullen ................... H02M 3/158
2021/0048453 A1* 2/2021 Chao .................... H03F 3/45071

OTHER PUBLICATIONS

Cheng, Yaping, et al., "A High-Sensitivity Current-Shunt Monitor with Extended Input Common-Mode Voltage Range", 2nd International Conference on Integrated Circuits and Microsystems, Nov. 8-11, 2017, pp. 14-17.
Shalmany, Saleh Heidary, et al., "A 36-A Integrated Current-Sensing System With a 0.3% Gain Error and a 400-uA Offset From -55° C. to +85° C.", IEEE Journal of Solid-State Circuits, vol. 52, No. 4, Apr. 2017, pp. 1034-1043.
Shalmany, Saleh Heidary et al., "±5 A Integrated Current-Sensing System With ±0.3% Gain Error and 16 μA Offset From—-55° C to +85° C", IEEE Journal of Solid-State Circuits, vol. 51, No. 4, Apr. 2016, 9 pages.

(Continued)

*Primary Examiner* — Tung X Nguyen
*Assistant Examiner* — Robert P Alejnikov, Jr.
(74) *Attorney, Agent, or Firm* — Slater Matsil, LLP

(57) ABSTRACT

In accordance with an embodiment, a method of measuring a load current flowing through a current measurement resistor coupled between a source node and a load node includes: measuring a first voltage across a replica resistor when a first end of the replica resistor is coupled to the source node and a second end of the replica resistor is coupled to a reference current source; measuring a second voltage across the replica resistor when the second end of the replica resistor is coupled to the source node and the first end of the replica resistor is coupled to the reference current source; measure a third voltage across the current sensing resistor; and calculating a corrected current measurement of the load current based on the measured first voltage, the measured second voltage and the measured third voltage.

20 Claims, 3 Drawing Sheets

(56) References Cited

OTHER PUBLICATIONS

Witte, Johan F., et al., "A Current-Feedback Instrumentation Amplifier With 5 µV Offset for Bidirectional High-Side Current-Sensing", IEEE Journal of Solid-State Circuits, vol. 43, No. 12, Dec. 2008, 7 pages.
Xie, Peng et al., "A Low-Noise, Low-Power, and Chopper-Stabilized, Current-Feedback Instrumentation Amplifier for Current Sensing Application", The 4th International Conference on Integrated Circuits and Microsystems, Oct. 25-27, 2019, pp. 162-165.
Xu, Shalmany et al., "A +/-12A High-Side Current Sensor With 25V Input CM Range and 0.35% Gain Error From -40C to 85C", IEEE Solid-State Circuits Letters, vol. 1, No. 4, Apr. 2018, 4 pages.
Xu, Long et al., "A ±4-A High-Side Current Sensor With 0.9% Gain Error From -40° C. to 85° C. Using an Analog Temperature Compensation Technique", IEEE Journal of Solid-State Circuits, vol. 53, No. 12, Dec. 2018, 9 pages.

\* cited by examiner

PRIOR ART

PRIOR ART

CURRENT SENSING CIRCUIT

CROSS-REFERENCE TO RELATED APPLICATIONS

This application claims the benefit of Italian Patent Application No. 102021000010766, filed on Apr. 28, 2021, which application is hereby incorporated herein by reference.

TECHNICAL FIELD

Embodiments are directed to current sensing circuits.

BACKGROUND

Accurate estimation of absorbed power is a desirable feature in RX/TX (receiver/transmitter) wireless charger devices. Such estimation is facilitated by integrated circuits that provide an accurate current sensing feature.

Various conventional solutions proposed to that effect include a (high-side) shunt resistor (briefly, "shunt") followed by an analog front end (amplifier, filter), an analog-to-digital converter (ADC) and digital back-end processing.

Shunt accuracy and stability have direct consequences on measurement accuracy.

Conventional solutions to address these issues can be ascribed to two different approaches.

A first approach involves using external "discrete" shunt resistors, which can be accurate and stable.

Drawbacks possibly associated to such an approach include cost, package complexity and difficulty in calibrating the chip alone.

Another approach involves using integrated shunt resistors and applying temperature calibration.

An issue related to such other approach lies in that temperature calibration involves accurate temperature sensing and may not be able to compensate drifts, which may occur after in-factory calibration. Accuracy over the expected lifetime of the circuit and the associated device is correspondingly reduced.

SUMMARY

One or more embodiments may relate to a corresponding device. A wireless charging device may be exemplary of such a device.

One or more embodiments may be related to a corresponding method.

One or more embodiments facilitate achieving a high overall accuracy over the whole lifetime of a high-side current sensor based on an integrated shunt resistor with a run-time self-calibration capability.

One or more embodiments involve features which can be added to basic current sensor architecture, namely: an accurate current reference, based on a switched/capacitor approach, for instance, a scaled replica of the shunt resistor which can comprise a set of resistance elements like the elements used for the shunt resistor, with the shunt resistor and the replica forming an interdigitated structure, and a set of (high-voltage, HV) switches configured to switch the inputs of an amplifier stage between coupling to the output pins of the shunt resistor and coupling to the output pins of the shunt replica, and a digital signal processing circuit block which can be used to apply runtime calibration coefficients to a digital output from the measurement function.

In one or more embodiments, a replica shunt can be provided which is adequately matched with the shunt resistor (e.g., by being co-located, that is arranged at the same location, possibly with mutually interdigitated structures) and the same analog front end circuitry (amplifier, advantageously followed by an analog-to-digital converter) can be used during a self-test phase and a current measurement phase. This facilitates relying on the assumption that the offset and sensitivity drifts of the self-test chain are the same as the offset and the sensitivity drifts of the measurement chain. Accordingly, the output of the current sensor can be calibrated at runtime using information acquired during a self-test phase.

In one or more embodiments, shunt and analog front-end inaccuracies can be tracked and compensated continuously.

Advantageously, in one of more embodiments, a self-test reference current which is stable (over the circuit lifetime) can be provided using a switched-capacitor reference generator capable of producing a current which is dependent on a bandgap voltage, a clock frequency and a capacitance. It is noted that such elements may be (much) more stable than shunt resistors and are currently available in production.

One or more embodiments may offer advantageous features such as: an accurate current reference, based on switched-capacitor approach; a scaled replica of the shunt resistor is provided which includes a set of resistance elements equal to the elements used for the shunt resistor with interdigitated architecture; a set of (high-voltage, HV) switches can be used to periodically switch the input of the amplifier from the shunt output pins to the shunt replica output pins; a digital signal processing block can be used to apply runtime calibration coefficients to the measurement digital output; and a temperature sensor and a temperature compensation circuitry (as commonly used in conventional solutions) can be dispensed with.

BRIEF DESCRIPTION OF THE DRAWINGS

One or more embodiments will now be described, by way of example only, with references to the annexed figures, wherein.

DETAILED DESCRIPTION OF ILLUSTRATIVE EMBODIMENTS

Figure 1:
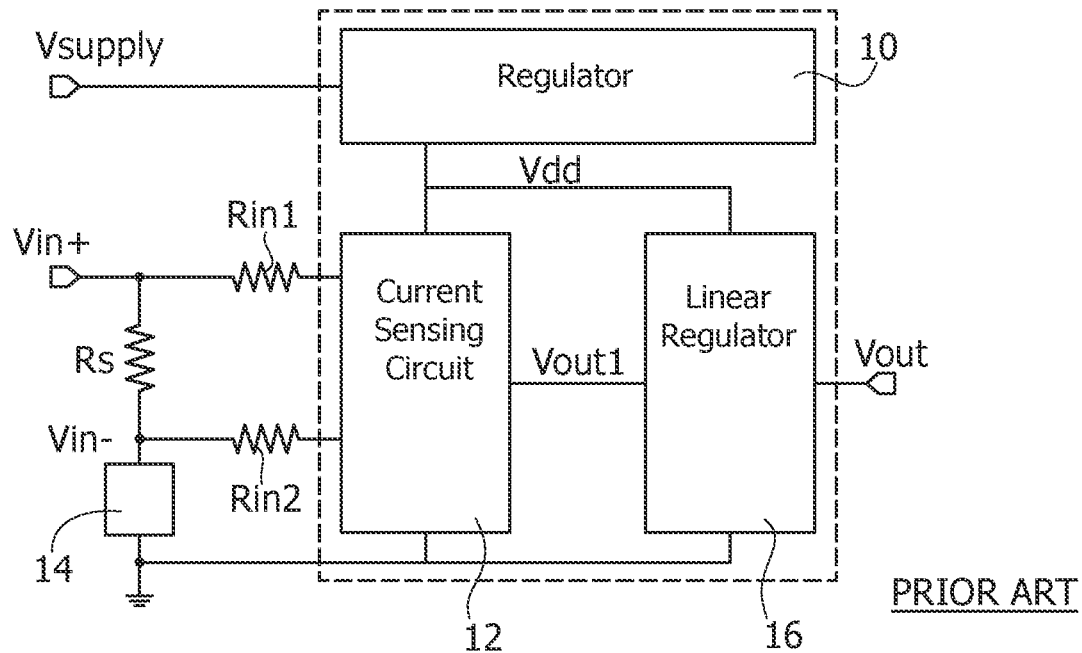
FIG. 1 is a block diagram of a conventional current-shunt monitor.

In the ensuing description, various specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Also, throughout this description a same designation ($V_{RECT}$, or $V_{LOAD}$, for instance) may be used for simplicity to refer both to a certain circuit node/element signal and to a signal which may occur at that node/element.

In the area of wireless charging, accurate measurement of the current absorbed by both the transmission circuit and the receiver circuit plays a significant role.

Together with voltage measurement, current measurement provides an indication of the power transmitted and received by a system. Information related to power transmitted and received is significant insofar as specifications introduced in standard protocols used in wireless charging context rely on such information.

The capability of measuring accurately a current in a system such as a high-voltage system (particularly at the high side thereof) may benefit from the availability of efficient sensor elements such as a shunt resistor.

The capability of "reading" with high accuracy a current (and the capability of maintaining such accuracy over the whole lifetime of a certain device) are generally appreciated beyond the area of wireless charging.

Consequently, embodiments as discussed herein are not limited to possible use in the area of wireless charging: one or more embodiments can be applied, in general, to a variety of current measurement circuits including a sensitive element of a resistive type (shunt) integrated in a same chip with an associated front-end readout circuitry with such circuits expected to exhibit a high degree of accuracy over time, particularly in solutions operating under high voltage conditions (high-side sensing topology).

Various practical applications (wireless charging in consumer electronics may again be referred to as a non-limiting example of such an application) use a shunt resistor (briefly referred to as a "shunt") as a sensitive element for measuring a current based on Ohm's Law.

According to Ohm's Law, V=R*I, a current of intensity I flowing through a resistor produces a voltage drop V across the resistor which is proportional to the resistance value R of the resistor. Such a voltage drop can be possibly converted into digital and thus provide a "reading" of the current intensity.

Such an approach may be advantageous for various reasons, including low-cost, integrability on a semiconductor material (silicon, for example) using standard processes, and direct measurement of the current.

However, such an approach may exhibit certain drawbacks related to accuracy. In fact, current measurement obtained via a shunt resistor is (linearly) dependent on the resistance value of the shunt resistor.

Resistors integrated on, e.g., silicon, using standard processes, may exhibit inaccurate resistance values due to reasons such as process spread during silicon diffusion, thermal drift, and sensitivity to mechanical stresses and ageing. Moreover, if the circuit where an (absorbed) current is measured is an H bridge with a high-voltage supply (this may be the case of a transmitter or receiver for wireless charging), the shunt resistor may be arranged in series with the supply path to the bridge. As a result, the voltage drop across the resistor may exhibit a common mode near the bridge supply, which may be as high as tens of volts.

Another constraint deriving from using a shunt resistor is related to the resistance value being desired to be kept small in order to have a reduced impact on the efficiency of the H bridge. The voltage value that can be read across the shunt resistor is thus correspondingly reduced, usually in the order of a few mV. This almost inevitably involves using a low-offset, low-noise amplifier stage to amplify such a weak voltage signal. This in turn involves other factors having to be taken into account, namely the common-mode rejection ratio (CMRR) of the amplifier and the offset of the amplifier (and an analog-to-digital converter, ADC, possibly associated therewith).

To sum up, the main factors, which adversely affect accuracy, involve: as regards the shunt resistor, process spread, thermal drift, drift due to mechanical stress and ageing; and as regards the amplifier, CMRR and offset.

Various approaches have been proposed in order to deal with these possible sources of inaccuracy. While effective, some of these approaches may exhibit various drawbacks.

For instance, process spread issues related to the shunt resistor can be addressed via in-factory calibration of each individual device; this is inevitably a time-consuming process, which adversely affects cost.

Amplifier offset and its drift over time can be countered using chopping or self-zeroing techniques, which facilitate obtaining amplifiers exhibiting low offset values. Issues related to the amplifier CMRR can be addressed resorting to architectures involving components exhibiting good matching at a cost of a certain increase of the area occupied on silicon. Thermal drift of the shunt resistors can be addressed via in-factory calibration at different temperatures.

All these measures are however fairly expensive to implement and are hardly suited for wireless chargers as extensively used in the consumer market where cost and simplicity are important factors.

Solutions based on automatic compensations can be considered as possible alternatives.

Sensitivity of the shunt resistor to mechanical stresses and various ageing phenomena is a largely unresolved problem, which places strong limitations on the overall accuracy of a current measuring system. After-solder drift or after-thermal cycles represent other limiting factors for the accuracy of current measurement systems based on integrated shunt resistors.

The circuit diagram of FIG. 1 is exemplary of an arrangement disclosed by Cheng, Huang, in: "A High Sensitivity Current-Shunt Monitor with Extended Input Common-Mode Voltage Range", International Conference on Integrated Circuits and Microsystems, 2017. The arrangement illustrated in FIG. 1 includes a low-voltage output regulator 10 which receives a supply voltage $V_{supply}$ and provides a regulated voltage Vdd to a current sensing circuit 12 having two inputs coupled via resistors Rin1, Rin2 to the opposed ends of an external shunt resistor $R_s$ coupled between a first voltage Vin+ and a second voltage Vin− with a load 14 coupled between the input voltage Vin− and ground.

The current sensing circuit 12 provides an output voltage $V_{OUT1}$ to a linear regulator 16, sensitive to the voltage Vdd that provides an output voltage $V_{OUT}$.

A system as illustrated in FIG. 1 addresses adequately various accuracy problems using an integrated amplifier having a low-offset and high CMRR coupled with an external, discrete shunt resistor $R_s$, namely a resistance that is not integrated in the chip.

This solution may provide a good degree of accuracy. It is otherwise hardly attractive for cost reasons, due to factors such as: the inherent cost of the discrete resistor; increased package and board complexity due to at least four additional pads involved in connecting the external components; and intrinsic difficulty in performing in-factory system calibration, which almost inevitably involves system calibration performed after assembly of the whole application board.

Figure 2:
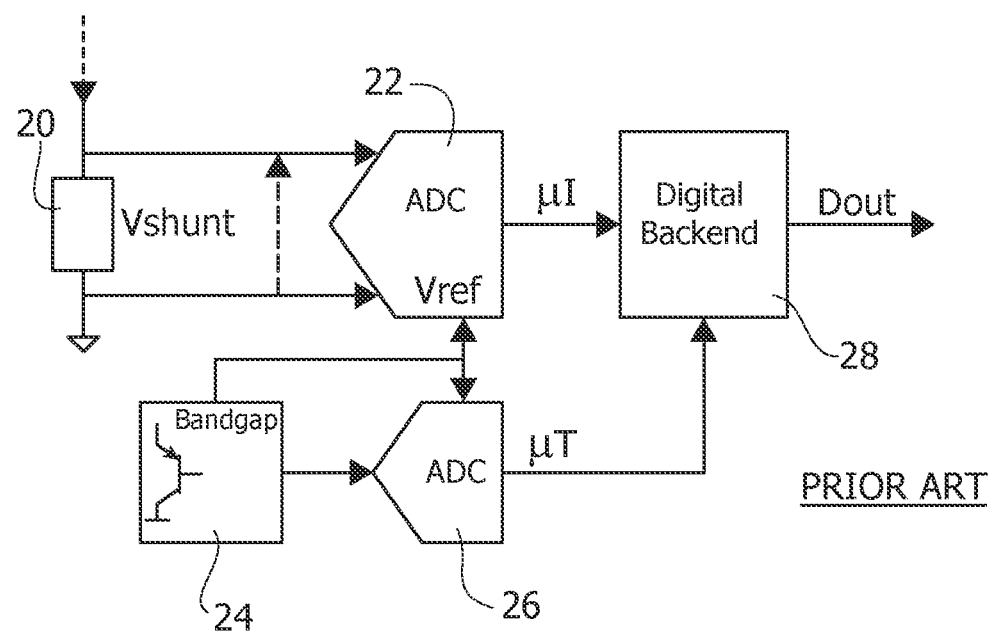
FIG. 2 is a block diagram of another conventional current sensor including an integrated shunt.

The diagram of FIG. 2 corresponds to a solution as disclosed by Shalmany, Draxelmayr, and Makinwa, in: "A±36A Integrated CSS with a 0.3% Gain Error and a 400 uA Offset", IEEE Journal of solid-state circuits, April 2017. This arrangement again involves a shunt resistor 20 intended to be traversed by a current I to be measured and to generate a shunt voltage $V_{shunt}$ which is converted to digital in a (first) analog-to-digital converter 22.

A bandgap reference generator 24 produces a reference signal $V_{Ref}$ which is applied to the analog-to-digital converter 22 as well as to a further analog-to-digital converter 26. The output signals from the two converters 22, 26 (namely µI and µT, respectively) are applied to a digital backend circuit 28 which produces a resulting output signal $D_{OUT}$ based on the signals from the converters 22 and 26.

An arrangement as illustrated in FIG. 2 lends itself to integrating the shunt resistor 20 together with a low-offset readout circuitry.

Issues related to the thermal variation of the resistance value of the shunt resistor 20 are addressed by thermal compensation implemented via an integrated digital algorithm. That algorithm performs compensation based on information on temperature (as sensed via the bandgap generator 24 and the analog-to-digital converter 26) and the thermal coefficient of the shunt resistor 20.

It is found that such a thermal compensation may not be adequate for two main reasons. First, thermal compensation is based on a pre-determined thermal coefficient which is fixed and may be inaccurate. In any case, thermal compensation does not track possible variations of the shunt resistance value and its thermal coefficient as resulting, for instance, from soldering and ageing. Second, a temperature sensor capable of detecting with a high degree of accuracy the exact temperature of the shunt resistor is not easy to implement: in the presence of a high current flowing in a localized manner in the shunt resistor, appreciable thermal gradients may develop between the location of the shunt resistor and the location of the temperature sensor, even if both of them are located on a same chip.

Figure 3:
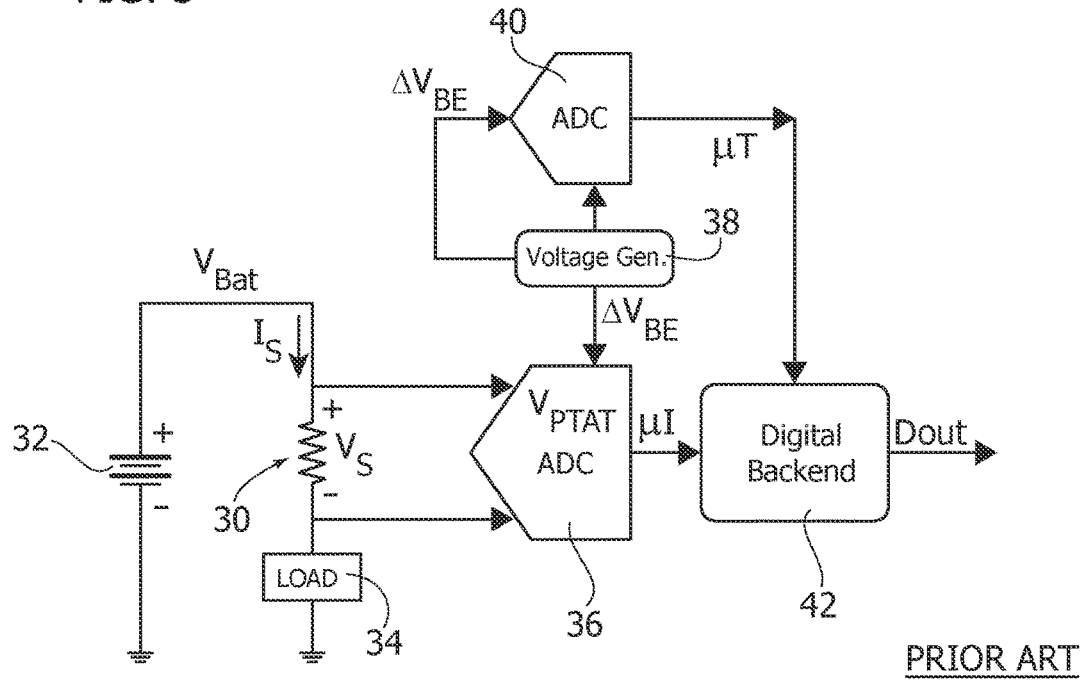
FIG. 3 and FIG. 4 are circuit diagrams of other conventional current sensors.
Figure 4:
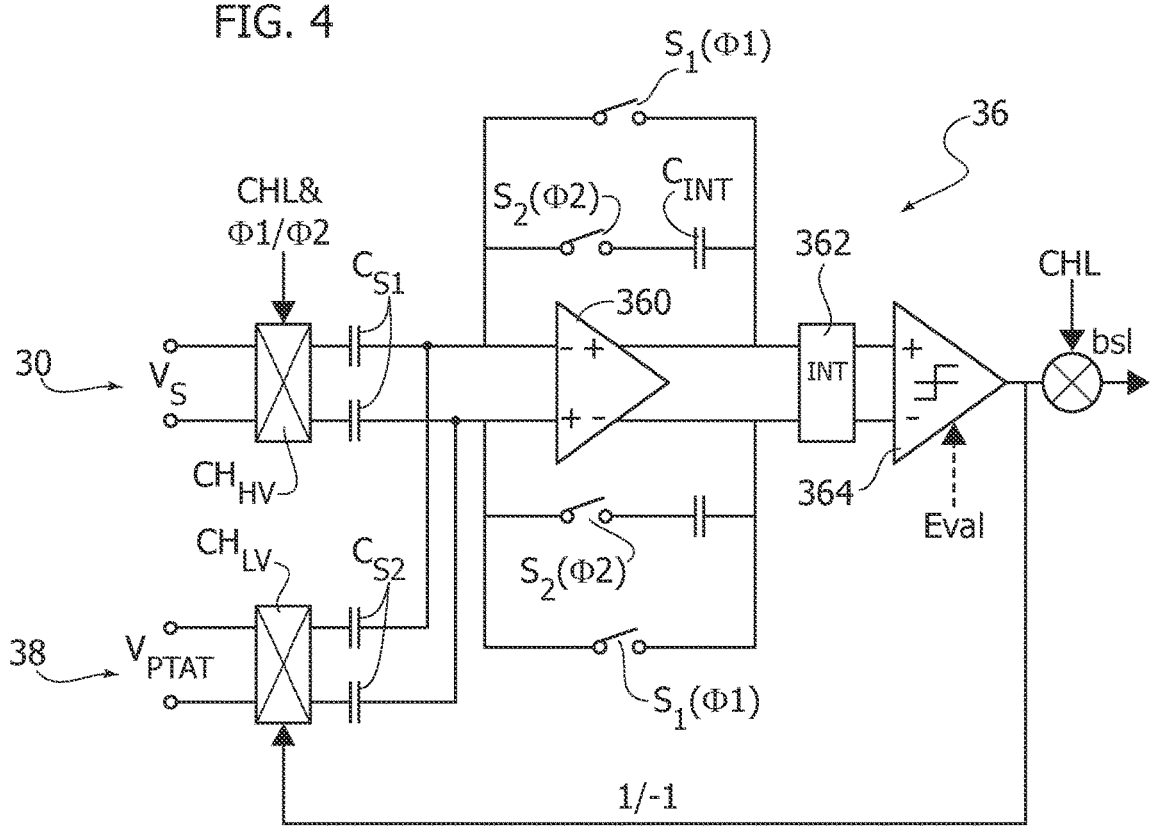

The diagrams of FIGS. 3 and 4 are exemplary of a solution as disclosed in Xu, Shalmany, Huijsing, and Makinwa: "A+/−12-A High-Side Current Sensor With 25V Input CM Range and 0.35% Gain Error From −40° C. to 85° C."; IEEE Solid-State Circuits Letters, Vol. 1, No. 4, April 2018. Here again a shunt resistor 30 is provided configured to be traversed by a current $I_S$ as a result of being coupled to a supply source (battery) 32 providing a voltage $V_{Bat}$.

The voltage across the "+" and "−" terminals of the shunt resistor 30 (with the negative end coupled to a load 34 referenced to ground) is applied to a (high-voltage) analog-to-digital converter 36.

A reference voltage generator 38 supplies a signal $\Delta V_{BE}$ of the Proportional to Absolute Temperature, PTAT type to the converter 36 as well as to a further analog-to-digital converter 40 which also receives a reference bandgap voltage $V_{BG}$ from the generator 38.

As in the case illustrated in FIG. 2, the analog-to-digital converters 36 and 40 in FIG. 3 provide respective output signals µI and µT to digital backend circuitry 42 which provides an output signal $D_{out}$.

FIG. 4 is a circuit diagram exemplary of a possible implementation of the analog-to-digital converter 36, built around a fully differential amplifier stage 360 with feedback networks including switched capacitors configured to receive the voltage signal $V_s$ across the shunt resistor $R_s$, and the voltage $V_{PTAT}$ via input coupling capacitors $C_{S1}$, $C_{S2}$.

As illustrated in FIG. 4, the converter 36 may also include a second integrator stage 362, which supplies an output quantizer 364 whose output is fed back to the input to which the voltage $V_{PTAT}$ is applied in an arrangement that can be essentially likened to a delta-sigma-modulator.

The arrangement of FIGS. 3 and 4 is again based on an integrated shunt resistor which is coupled with an amplifier (360 in FIG. 4) with dynamic offset cancellation achieved by chopper operation and which also exhibits a high CMRR value due to the fully-differential architecture with a capacitive input.

The arrangement exemplified in FIGS. 3 and 4 also provides compensation of thermal variations in the shunt resistor 30 with a mixed analog/digital approach.

Again, an issue with such type of thermal compensation lies in the inability to follow variations in the shunt resistor and its thermal coefficient occurring after device calibration (post-solder drift and ageing).

Figure 5:
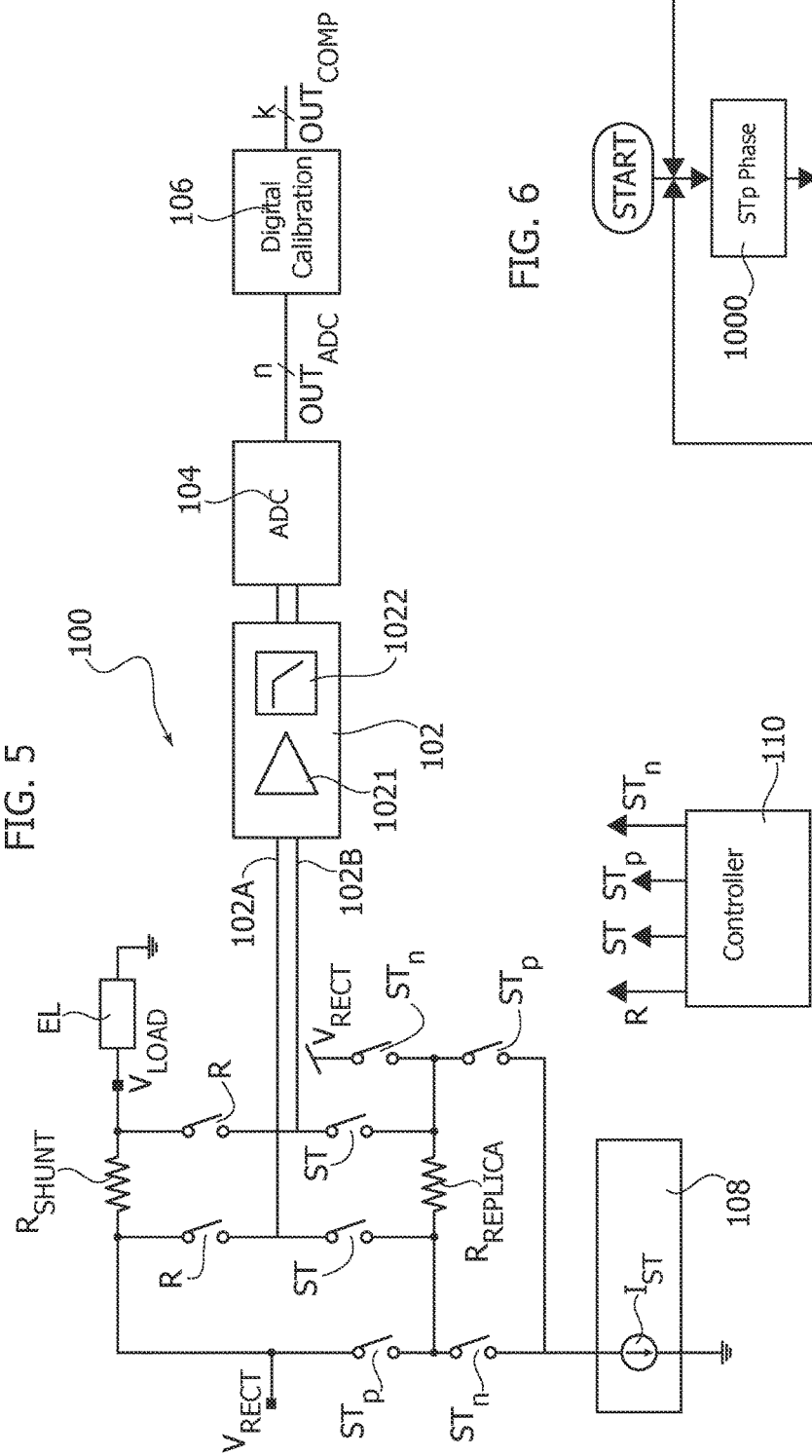
FIG. 5 is a block diagram of a circuit according to embodiments of the present description.

An arrangement as exemplified in FIG. 5, designated 100 as a whole, includes an input node $V_{RECT}$ that is configured to be coupled to a (high) voltage to supply an electrical load EL with a current, which represents the current to be measured. For instance, the node $V_{RECT}$ may correspond to the supply pin of an inverter (in the exemplary case of a wireless power transmitter) or the output pin of a rectifier (in the case of wireless power receiver).

It is again noted that reference to a possible use in wireless power supply transmitter/receivers is merely exemplary and not limiting of the possible applications of the embodiments.

As noted, the current intended to be measured in an arrangement as illustrated in FIG. 5 is the current flowing between the $V_{RECT}$ pin and an electrical load EL through a shunt resistor $R_{SHUNT}$ coupled intermediate the node $V_{RECT}$ and the load EL.

It is otherwise noted that the electrical load EL may be a distinct element from the embodiments, which is an element intended to be coupled to the circuitry illustrated in FIG. 5 only in a final device.

In a circuit 100 as illustrated in FIG. 5, a replica of the shunt resistor $R_{SHUNT}$ is provided, designated $R_{REPLICA}$. In one of more embodiments, the replica resistor $R_{REPLICA}$ can be implemented to comprise (possibly scaled) resistive elements identical to the resistive elements of the main shunt resistor $R_{SHUNT}$.

Advantageously, such resistive elements of the shunt resistor $R_{SHUNT}$ and the replica resistor $R_{REPLICA}$ are co-located (that is integrated at the same location or in close proximity to each other) and/or exhibit mutually interdigitated layout.

This facilitates achieving conditions where both the main shunt resistor $R_{SHUNT}$ and the replica resistor $R_{REPLICA}$ are exposed to the same environmental conditions. This option may be advantageous in so far as it facilitates reproducing in the replica resistor $R_{REPLICA}$ the same behavior of the shunt resistor $R_{SHUNT}$ in respect of phenomena such as thermal drift, post-solder drift and ageing.

That is, the replica resistor $R_{REPLICA}$ and the shunt resistor $R_{SHUNT}$ can be assumed to exhibit substantially equal relative variations of their resistance values resulting from those phenomena.

Reference 102 in FIG. 5 denotes analog front-end (AFE) circuitry including a (high-voltage) amplifier (having a gain G) 1021 having input nodes 102A, 102B and followed by a cascaded low-pass filter 1022.

The signal output from the analog front-end circuitry 102 (which is a function of the voltage applied between the input nodes 102A, 102B) is supplied to an analog-to-digital converter 104, configured to convert to digital the output signal from the analog front-end circuitry 102 and provide a (digital) output signal $OUT_{ADC}$ (n-bit for instance).

Briefly, FIG. 5 is illustrative of a circuit 100 comprising an input node $V_{RECT}$ configured to have an input signal applied thereto and a load node $V_{LOAD}$ configured to be coupled to an electrical load EL to supply the electrical load EL with a load current.

As illustrated in FIG. 5, a shunt resistor $R_{SHUNT}$ is arranged intermediate the input node $V_{RECT}$ and the load node $V_{LOAD}$, so that, with the input signal applied to the input node $V_{RECT}$ and the load node $V_{LOAD}$ coupled to the electrical load EL, the voltage drop across the shunt resistor $R_{SHUNT}$ is indicative of the intensity of the load current supplied to the electrical load EL.

The gain circuitry 102 illustrated in FIG. 5 has a first sensing node 102A and a second sensing node 102B and is configured to produce an output signal $OUT_{ADC}$ which is a function of the voltage drop between the first sensing node 102A and the second sensing node 102B.

A replica resistor $R_{REPLICA}$ is provided replicating the shunt resistor $R_{SHUNT}$, wherein the replica resistor $R_{REPLICA}$ and the shunt resistor $R_{SHUNT}$ are configured to exhibit substantially equal relative (e.g., percentage) variations of their resistance values due to factors such as process spread, thermal drift, drift due to mechanical stress and ageing. The replica resistor $R_{REPLICA}$ has a first end and a second end.

As illustrated in FIG. 5, the digital output signal $OUT_{ADC}$ is supplied to a digital calibration circuit 106 configured to produce a compensated output signal $OUT_{COMP}$ (k-bit, for instance).

Reference current generator 108 shown in FIG. 5 is configured to generate a current having an intensity $I_{ST}$. The reference current generator 108 can be implemented in any manner known to those of skill in the art. Advantageously, the reference current generator 108 comprises a switched-capacitance reference generator 108.

Likewise, unless the context discussed in the following indicates otherwise, the analog front-end circuitry 102 and the analog-to-digital converter 104 can be regarded as conventional in the art, which makes it unnecessary to provide a more detailed description herein.

This also applies to the digital calibration block 106, which calculates and applies calibration coefficients to the digital output signal $OUT_{ADC}$ from the converter 104.

In that respect, it will be appreciated the embodiments are primarily concerned with the way these calibration coefficients can be derived (exploiting, e.g., the provision of the replica resistor $R_{REPLICA}$ and the associated switching circuitry discussed in the following), rather than with the way these coefficients can be applied to the signal $OUT_{ADC}$ In fact, one or more embodiments may be largely "transparent" with respect to the way these coefficients are applied to the signal $OUT_{ADC}$ to produce the compensated output signal $OUT_{COMP}$ One or more embodiments as illustrated in FIG. 5 facilitate achieving a high accuracy in sensing (measuring) the current flowing from the node $V_{RECT}$ to the load EL implementing a high-side current sensor comprising an integrated shunt resistor (such as $R_{SHUNT}$).

Circuitry as illustrated in FIG. 5 takes into account (and compensates) also those losses in terms of accuracy which may occur after a possible in-factory calibration of the device over the whole lifetime of the circuit and of the associated system, by implementing continuous in-field self-calibration.

To that effect, a circuit as illustrated in FIG. 5 comprises a set of (high-voltage) electronic switches (such as MOSFET transistor, for instance) indicated as R, ST, STp and STn. These electronic switches are configured to be turned "on" (that is, made conductive) and "off" (made non-conductive) in response to homologous control signals R, ST, STp, STn, provided by a controller circuit such as a microcontroller no.

The controller circuit no can be configured (in a manner known per se to those of skill in the art) in order to implement operation sequences as exemplified in connection with the flow-chart of FIG. 6 to be discussed as follows.

Briefly, as illustrated in FIG. 5, the switches designated R couple (when conductive) the opposed ends of the shunt resistor $R_{SHUNT}$ to the nodes 102A, 102B, namely to the (differential) input of the amplifier 1021 in the analog front-end circuitry 102. The switches designated ST couple (when conductive) the opposed ends of the replica resistor $R_{REPLICA}$ to the nodes 102A, 102B, namely to the (differential) input of the amplifier 1021 in the analog front-end circuitry 102.

It is noted that such coupling of the main resistor $R_{SHUNT}$ and the replica resistor $R_{REPLICA}$ to the input of the differential amplifier 1021 is with homologous polarities, that is with the same sign.

Also, as illustrated in FIG. 5, of the two switches designated STp, a first one is located intermediate the input node $V_{RECT}$ and a first end of the replica resistor $R_{REPLICA}$, and the second one intermediate the second end of the replica resistor $R_{REPLICA}$, and the reference current generator 108. Consequently, when conductive, the switches STp cause a current equal to $I_{ST}$ to flow through the replica resistor $R_{REPLICA}$ from the node $V_{RECT}$ to the reference generator 108 in a first direction (from the first end to the second end). Of the two switches designated STn, a first one is located intermediate the input node $V_{RECT}$ and the second end of the replica resistor $R_{REPLICA}$, and the second one intermediate the first end of the replica resistor $R_{REPLICA}$, and the reference current generator 108. Consequently, when conductive, the switches STn cause a current equal to $I_{ST}$ to flow through the replica resistor $R_{REPLICA}$ from the node $V_{RECT}$ to the reference generator 108 in a second direction (from the second end to the first end), opposite the first direction.

Figure 6:
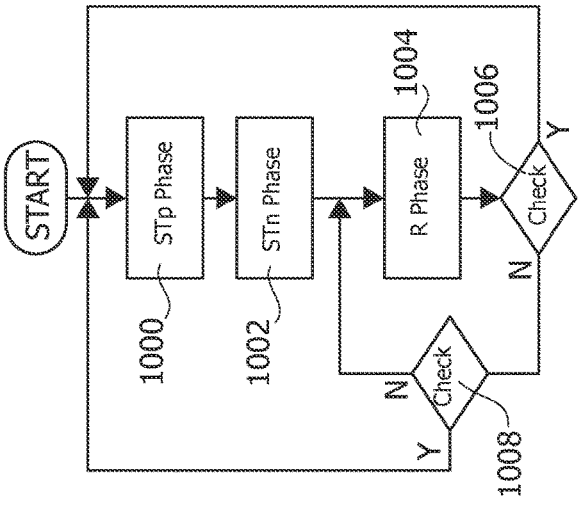
FIG. 6 is flow-chart exemplary of possible operation of a circuit according to embodiments of the present description.

The flowchart of FIG. 6 is exemplary of a possible operation of the circuit as illustrated in FIG. 5, which depicts a first mode, represented by block 1000 (STp phase) and block 1002 (STn phase), and in a second mode, represented by block 1004 (R phase).

During the STp phase of block 1000: the switches R are non-conductive and the switches ST conductive and the replica resistor $R_{REPLICA}$ is coupled across the differential input of the differential amplifier 1021 in the analog front-end circuitry 102; and the switches STp are conductive (with the switches STn non-conductive) and the replica resistor $R_{REPLICA}$ is traversed by a current with intensity $I_{ST}$ flowing from the first end to the second end, that is, from left to right n in the representation of FIG. 5. In the STp phase of block 1000 the output $OUT_{ADC}$ from the converter 104 is is designated $OUT_{ADCSTp}$.

During the STn phase of block 1002: the switches R are non-conductive and the switches ST conductive and the replica resistor $R_{REPLICA}$ is again coupled across the differential input of the differential amplifier 1021 in the analog front-end circuitry 102; and the switches STn are conductive (with the switches STp non-conductive) and the replica resistor $R_{REPLICA}$ is traversed by a current with intensity LT flowing from the second end to the first end, that is, from right to left in the representation of FIG. 5, that is in the opposite direction with respect to the STp phase of block 1000. In the STn phase of block 1002 the output $OUT_{ADC}$ from the converter 104 is is designated $OUT_{ADCSTn}$.

That is, during the first mode of operation represented by blocks 1000 and 1002 in FIG. 6 the replica resistor $R_{REPLICA}$ is: coupled between the first sensing node 102A and the second sensing node 102B of the gain circuitry 102, and coupled to the current generator 108 to be traversed by the reference current $I_{ST}$, alternately, in a first direction and a second direction, the second direction opposite the first direction. The output signal $OUT_{ADC}$ from the gain circuitry thus assumes: a first value, $OUT_{ADCSTp}$ in response to the reference current $I_{ST}$ traversing the replica resistor $R_{REPLICA}$ in the first direction, and a second value, $OUT_{ADCSTn}$ in response to the reference current ($I_{ST}$) traversing the replica resistor $R_{REPLICA}$ in the second direction.

During the R phase of block 1004, the switches R are conductive and the switches ST non-conductive (with the switches STp and STn similarly non-conductive to avoid unnecessary power absorption in the replica resistor $R_{REPLICA}$) so that the shunt resistor $R_{SHUNT}$ is coupled across the differential input of the differential amplifier 1021 in the analog front-end circuitry 102, to sense the voltage across the resistor $R_{SHUNT}$ coupled intermediate the node $V_{RECT}$ and the load EL. In the R phase of block 1004 the output $OUT_{ADC}$ from the converter 104 is designated $OUT_{ADCR}$.

That is, during the second mode of operation represented by block 1004, the shunt resistor $R_{SHUNT}$ is coupled between the first sensing node 102A and the second sensing node 102B of the gain circuitry 102 and the output signal $OUT_{ADC}$ from the gain circuitry 102 assumes a third value, $OUT_{ADCR}$.

The following formulas describe operation of the circuit 100 along the lines of the flow-chart of FIG. 6.

The following definitions facilitate reading and understanding the formulas reproduced below:

$V_{OFFAFE}$: offset of AFE 102 (e.g., amplifier 1021 and filter 1022);

$V_{CMAFE}$: error due to finite CMRR in the AFE block;

$V_{OFFADC}$: offset of ADC 104;

$R_{SHUNT0}$: initial value of the shunt resistance $R_{shunt}$ (this can be measured during in-factory calibration);

$R_{REPLICA0}$: initial value of the replica resistance $R_{REPLICA}$ (this can be measured during in-factory calibration)

$G_0$: initial value of the gain G (this can be measured during in-factory calibration) of AFE 102;

$I_{ST0}$: initial value of the reference current $I_{st}$ (this can be measured during in-factory calibration); and $SENS_{ST0}$: output from the phase 'ST' at "zero time" (this can be measured during in-factory calibration and stored in a memory, e.g., in the controller 110).

The formulas are as follows: Output in the R phase (block 1004)

$$OUT_{ADCR} = I_{IN} \cdot R_{SHUNT0} \cdot \left(1 + \frac{\Delta R_{SHUNT}}{R_{SHUNT0}}\right) \cdot G_0 \cdot \left(1 + \frac{\Delta G}{G_0}\right) + V_{OFFAFE} + V_{CMAFE} + V_{OFFADC}.$$

Output in the phases 'STp' and 'STn' of blocks 1000 and 1002:

$$OUT_{ADCSTp} = I_{ST} \cdot R_{REPLICA0} \cdot \left(1 + \frac{\Delta R_{REPLICA}}{R_{REPLICA0}}\right) \cdot G_0 \cdot \left(1 + \frac{\Delta G}{G_0}\right) + V_{OFFAFE} + V_{CMAFE} + V_{OFFADC}$$

$$OUT_{ADCSTn} = -I_{ST} \cdot R_{REPLICA0} \cdot \left(1 + \frac{\Delta R_{REPLICA}}{R_{REPLICA0}}\right) \cdot G_0 \cdot \left(1 + \frac{\Delta G}{G_0}\right) + V_{OFFAFE} + V_{CMAFE} + V_{OFFADC}.$$

The calculation performed in the digital calibration circuit block 106 in order to calculate the compensated output $OUT_{COMP}$ may comprise:

$$OFF_{ST} = \frac{OUT_{ADCSTp} + OUT_{ADCSTn}}{2} = V_{OFFAFE} + V_{CMAFE} + V_{OFFADC}$$

$$SENS_{ST} = \frac{OUT_{ADCSTp} + OUT_{ADCSTn}}{2} = I_{ST} \cdot R_{REPLICA0} \cdot \left(1 + \frac{\Delta R_{REPLICA}}{R_{REPLICA0}}\right) \cdot G_0 \cdot \left(1 + \frac{\Delta G}{G_0}\right)$$

$$SENS_{ST0} = I_{ST0} \cdot R_{REPLICA0} \cdot G_0$$

$$SENS_{DRIFT} = \frac{SENS_{ST}}{SENS_{ST0}} = \frac{I_{ST}}{I_{ST0}} \cdot \left(1 + \frac{\Delta R_{REPLICA}}{R_{REPLICA0}}\right) \cdot \left(1 + \frac{\Delta G}{G_0}\right)$$

$$OUT_{COMP} = \frac{(OUT_{ADCR} - OFF_{ST})}{SENS_{DRIFT}} = I_{IN} \cdot R_{SHUNT0} \cdot G_0 \cdot \frac{\Delta R_{SHUNT}}{R_{SHUNT0}} \cdot \frac{R_{REPLICA0}}{\Delta R_{REPLICA}} \cdot \frac{I_{ST}}{I_{ST0}}.$$

That is, in the possible implementation discussed herein, the calibration circuitry 106 is configured to: produce an average value, $$OFF_{ST} = \frac{OUT_{ADCSTp} + OUT_{ADCSTn}}{2} T$$

of the first value, $OUT_{ADCSTp}$ and the second value, $OUT_{ADCSTn}$; and produce the compensated output signal $OUT_{COMP}$ as a function of the difference ($OUT_{ADCR}$-$OFF_{ST}$) between the third value, $OUT_{ADCR}$ and the aforesaid average value, $OFF_{ST}$ of the first value, $OUT_{ADCSTp}$ and the second value, $OUT_{ADCSTn}$.

Also, in the possible implementation discussed herein, the calibration circuitry 106 is configured to: produce a normalization value, $$SENS_{DRIFT} = \frac{SENS_{ST}}{SENS_{ST0}}$$

which is a function of a difference $$SENS_{ST} = \frac{OUT_{ADCSTp} - OUT_{ADCSTn}}{2}$$

between the first value, $OUT_{ADCSTp}$ and the second value, $OUT_{ADCSTn}$, and normalize the compensated output signal $OUT_{COMP}$ with respect to the normalization value, $SENS_{DRIFT}$.

As illustrated in FIG. 5, the circuit 100 comprises analog-to-digital conversion circuitry (the ADC 104) intermediate the gain circuitry 102 and the calibration circuitry 106. Such analog-to-digital conversion circuitry 104 is configured to convert to digital the output signal $OUT_{ADC}$ from the gain circuitry 102. The calibration circuitry 106 can thus comprise digital circuitry configured to calculate the compensated output signal $OUT_{COMP}$ as a function of the values $OUT_{ADCSTp}$, $OUT_{ADCSTn}$ and $OUT_{ADCR}$ converted to digital.

Considering the expression for the compensated output:

$$OUT_{COMP} = IN \cdot R_{SHUNT0} \cdot G_0 \cdot \frac{\Delta R_{SHUNT}}{R_{SHUNT0}} \cdot \frac{R_{REPLICA0}}{\Delta R_{REPLICA}} \cdot \frac{I_{ST}}{I_{ST0}},$$

The resistor $R_{REPLICA}$ is a scaled replica of the resistor $R_{SHUNT}$. Also, it is exposed to the same thermal and mechanical stresses and to the same process-related variations (e.g., due to being co-located, possibly in an interdigitated arrangement). One may thus reasonably assume that the resistor $R_{REPLICA}$ will undergo relative variations $$\frac{\Delta R_{REPLICA}}{R_{REPLICA0}}$$

of its resistance value with respect to the initial value $R_{REPLICA0}$, that likewise replicate the relative variations $$\frac{\Delta R_{SHUNT}}{R_{SHUNT0}}$$

of the resistance value of $R_{SHUNT}$ with respect to the initial value $R_{SHUNT0}$ of $R_{SHUNT}$, namely:

$$\frac{\Delta R_{SHUNT}}{R_{SHUNT0}} = \frac{\Delta R_{REPLICA}}{R_{REPLICA0}},$$

that is, by referring to the expression for the compensated output:

$$\frac{\Delta R_{SHUNT}}{R_{SHUNT0}} \cdot \frac{R_{REPLICA0}}{\Delta R_{REPLICA}} = 1.$$

Assuming $I_{ST}$ is produced (in a manner known to those of skill in the art) by a switched-capacitance reference generator 108, $I_{ST}$ can be expressed as:

$$I_{ST} = V_{bg} \cdot C \cdot f_{ck}$$

where $V_{bg}$ is a bandgap voltage, C is a capacitance, and $f_{ck}$ is a clock frequency.

All these parameters can be regarded as essentially stable with respect to the value for $R_{shunt}$, and one can assume:

$$\frac{I_{ST}}{I_{ST0}} = 1.$$

By way of conclusion, the output after digital compensation corresponds to the expected output, without error contribution $$OUT_{COMP} = I_{IN} \cdot R_{SHUNT0} \cdot G_0.$$

During the phases designated STp and STn (blocks 1000 and 1002 in FIG. 6), the variation of the offset and gain of the entire chain including the resistor $R_{REPLICA}$, the analog front-end 102 and the analog-to-digital converter 104 can thus be measured.

As discussed, the replica resistor $R_{REPLICA}$ is a scaled replica of the shunt resistor $R_{SHUNT}$. Advantageously, the resistor $R_{REPLICA}$ and the shunt resistor $R_{SHUNT}$ comprise modules that are physically identical in an interdigitated arrangement. Consequently, one may reasonably assume that that the replica resistor $R_{REPLICA}$ undergoes the same variations occurring in the shunt resistor $R_{SHUNT}$ (thermal drift, mechanical stress and ageing).

Also, the analog front-end circuitry 102 and the analog-to-digital converter 104 are the same throughout all the phases of the blocks 1000, 1002 and 1004 of FIG. 6 and are affected by the same variations.

Consequently, the overall variations measured during the phases STP and STn can be used to compensate the offset and gain variations in the chain comprising the shunt resistor $R_{SHUNT}$, the analog front-end circuitry 102 and the analog-to-digital converter 104.

During the phase designated R (block 1004 in FIG. 6 a measured value of the current through the load EL is available at the output of the analog-to-digital converter 104, as $OUT_{ADR}$, including the error contributions due to the shunt resistor $R_{SHUNT}$, the analog front-end circuitry 102 and the analog-to-digital converter 104.

The digital calibration circuit 106 may exploit data acquired during the phases designated STp and STn of the blocks 100 and 1002 (primarily $OFF_{ST}$ and $SENS_{DRIFT}$) to compute the entity $OUT_{COMP}$.

As demonstrated, this corresponds to a reading (measurement) of the input current where all the error sources due to $R_{SHUNT}$, the analog front-end 102 and the analog-to-digital converter 104 are removed.

The flowchart of FIG. 6 is exemplary of the possibility for the blocks 1000 and 1002 being repeated automatically in a circuit exemplified in FIG. 5, for instance at times which may be (pre)determined as a function of an expected rate of variations of those parameters expected to affect accuracy and intended to be compensated.

For instance, in those applications where a high level of accuracy is desirable and/or for which relevant (thermal or mechanical) stress phenomena are expected to evolve rapidly over time, the steps of blocks 1000 and 1002 can be repeated before each step of measuring the current as represented by the block 1004.

This option is represented by a possible positive outcome (Y) of a check carried out in a step 1006 (high accuracy desired and/or significant, rapidly varying stresses expected). In that case, the steps of blocks 1000 and 1002 can be repeated after each current measurement step of block 1004.

A negative outcome (N) of the check of block 1006 can be regarded as indicative of conditions where a lower degree of accuracy is desired and/or stress sources are expected to evolve less rapidly over time.

In that case, a negative outcome (N) of a further check as represented by block 1008 may lead to a new measuring R phase being performed without going through a repetition of the STp and STn steps represented by the blocks 1000 and 1002.

Conversely, a positive outcome (Y) of the check of block 1008 may be exemplary of a threshold number of measuring steps R having been performed without self-calibration (as possibly indicated in an internal counter in the step 1004). Such a positive outcome of the check of block 1008 may thus result in calibration of blocks 1000 and 1002 being repeated prior to a new measuring step of block 1004.

That is, operation of a circuit 100 as discussed herein may comprise an alternation of the first mode (STp, and STn: blocks 1000, 1002 in FIG. 6) and the second mode (R: block 1004 in FIG. 6), wherein, selectively (see block 1006 in FIG. 6): an occurrence of the first mode 1000, 1002 takes place at each occurrence of the second mode 1004 (outcome Y of step 1006), or the first mode 1000, 1002 is repeated (outcome N of step 1006) after a number of occurrences (as determined in step 1008) of the second mode 1004.

It is noted that arrangement as discussed herein benefit from precise matching of the shunt resistor $R_{SHUNT}$ and the replica resistor $R_{REPLICA}$.

High resolution of the analog-to-digital converter 104 and accurate trimming of the gain of the cascaded arrangement of the analog front-end circuit 102 and the analog-to-digital converter 104, as well as reduced variations of the capacitance and the bandgap source used to generate the reference current $I_{ST}$ may represent other advantageous factors in facilitating adequate operation of an arrangement as exemplified in FIG. 5.

Simulation results show that, even taking into account possible non-idealities in the factors discussed in the foregoing, one or more embodiment can reduce the error affecting a compensated output such as $OUT_{CONF}$ as a function of temperature and other sources of error within a very narrow band around zero.

One or more embodiments therefore facilitate obtaining current measurement in a high-side arrangement, for instance, taking advantage of an integrated shunt resistor such as $R_{SHUNT}$ with the capability of compensating the main sources of error over the whole useful lifetime of the related device. This can be achieved via self-calibration, which can be repeated periodically in the field during operation of the device.

An advantage lies in the capability of compensating also those errors related to variations of the electrical parameters of the components in the circuit, which may occur after initial in-factory calibration.

In a device (by way of non-limiting example, a wireless charging device) including a circuit 100 as discussed herein having an electrical load EL coupled with the load node $V_{LOAD}$ the compensated output signal $OUT_{COMP}$ is indicative—with high accuracy—of the intensity of the load current supplied to the electrical load EL.

In an embodiment, a circuit comprises gain circuitry configured to produce an output signal, which is a function of the voltage drop across a shunt resistor traversed by a current applied to an electrical load. A replica resistor of the shunt resistor is provided which exhibit relative variations of the resistance value substantially equal to the relative variations of the resistance value of the shunt resistor. Switching circuitry is provided which is controllable in a first mode, wherein the replica resistor is coupled to the input of the gain circuitry and caused to be traversed in opposite directions by a reference current so that the output signal from the gain circuitry assumes a first value, OUTADCSTp and a second value, OUTADCSTn, respectively, in a second mode, wherein the shunt resistor is coupled to the input of the gain circuitry the output signal from the gain circuitry assumes a third value, OUTADCR. Calibration circuitry receives the output signal from the gain circuitry and produces as a function of the first, OUTADCSTp, second, OUTADCSTn, and third, OUTADCR, value a compensated output signal, which provides an accurate measurement of the current applied to the electrical load.

Without prejudice to the underlying principles, the details and embodiments may vary, even significantly, with respect to what has been described by way of example only without departing from the extent of protection.

What is claimed is:

1. A circuit, comprising:
   a shunt resistor coupled between an input node configured to have an input signal applied thereto and a load node configured to be coupled to an electrical load, wherein, with the input signal applied to the input node and the load node coupled to the electrical load, a voltage drop across the shunt resistor is indicative of a load current supplied to the electrical load;
   a replica resistor replicating the shunt resistor, the replica resistor having a first end and a second end;
   gain circuitry configured to produce an output signal that is a function of the voltage drop between a first sensing node and a second sensing node;
   a current generator configured to generate a reference current;
   a set of electronic switches configured to be switched in:
      a first mode, wherein the replica resistor is coupled between the first sensing node and the second sensing node of the gain circuitry, and coupled to the current generator to be traversed by the reference current, alternately, in a first direction and a second direction opposite the first direction, wherein the output signal from the gain circuitry assumes a first value in response to the reference current traversing the replica resistor in the first direction and a second value in response to the reference current traversing the replica resistor in the second direction, and
      a second mode, wherein the shunt resistor is coupled between the first sensing node and the second sensing node of the gain circuitry, and the output signal from the gain circuitry assumes a third value; and calibration circuitry configured to receive the output signal from the gain circuitry and to produce a compensated output signal as a function of the first value, the second value, and the third value.

2. The circuit of claim 1, wherein the replica resistor and the shunt resistor exhibit substantially equal relative variations of their resistance values.

3. The circuit of claim 1, further comprising:
first switching circuitry configured, when conductive, to couple the shunt resistor between the first sensing node and the second sensing node;
second switching circuitry configured, when conductive, to couple the replica resistor between the first sensing node and the second sensing node;
third switching circuitry configured, when conductive, to couple the first end and the second end of the replica resistor to the input node and to the current generator, respectively, wherein the replica resistor is traversed by the reference current flowing therethrough in the first direction; and
fourth switching circuitry configured, when conductive, to couple the second end and the first end of the replica resistor to the input node and to the current generator, respectively, wherein the replica resistor is traversed by the reference current flowing therethrough in the second direction, opposite the first direction; and
switching control circuitry configured to control the first, second, third and fourth switching circuitry:
in the first mode, wherein the second switching circuitry is made conductive to couple the replica resistor between the first sensing node and the second sensing node of the gain circuitry, and the third switching circuitry and the fourth switching circuitry are alternately made conductive, wherein the output signal from the gain circuitry assumes the first value in response to the third switching circuitry being made conductive and the second value in response to the fourth switching circuitry being made conductive, respectively, and
in the second mode, wherein the first switching circuitry is made conductive to couple the shunt resistor between the first sensing node and the second sensing node of the gain circuitry, and the output signal from the gain circuitry assumes the third value.

4. The circuit of claim 3, wherein:
the first switching circuitry comprises a first pair of electronic switches configured, when conductive, to couple opposite ends of the shunt resistor to the first sensing node and the second sensing node of the gain circuitry; and
the second switching circuitry comprises a second pair of electronic switches configured, when conductive, to couple the first end and the second end of the replica resistor to the first sensing node and the second sensing node of the gain circuitry.

5. The circuit of claim 4, wherein:
the third switching circuitry comprises a respective pair of electronic switches configured, when conductive, to couple the first end and the second end of the replica resistor to the input node and to the current generator, respectively; and
the fourth switching circuitry comprises a further respective pair of electronic switches configured, when conductive, to couple the second end and the first end of the replica resistor to the input node and to the current generator, respectively.

6. The circuit of claim 1, wherein the current generator comprises a switched-capacitance reference generator configured to produce a reference current as a function of a product of a bandgap voltage, a capacitance and a clock frequency.

7. The circuit of claim 1, further comprising analog-to-digital conversion circuitry coupled between the gain circuitry and the calibration circuitry, the analog-to-digital conversion circuitry configured to convert to digital the output signal from the gain circuitry, wherein the calibration circuitry comprises digital circuitry configured to calculate the compensated output signal as a function of the first value the second value and the third value with the first, second, and third values converted to digital.

8. The circuit of claim 1, wherein:
the gain circuitry comprises a differential amplifier wherein the first sensing node and the second sensing node provide a differential input to the differential amplifier; or
the gain circuitry comprises a low-pass filter at an output of the gain circuitry.

9. The circuit of claim 1, wherein the replica resistor is co-located with the shunt resistor, wherein the replica resistor and the shunt resistor comprise mutually interdigitated structures.

10. The circuit of claim 1, wherein the calibration circuitry is configured to:
produce an average value of the first value and the second value; and
produce the compensated output signal as a function of a difference between the third value and the average value of the first value and the second value.

11. The circuit of claim 1, wherein the calibration circuitry is configured to:
produce a normalization value, which is a function of a difference between the first value and the second value; and
normalize the compensated output signal with respect to the normalization value.

12. A device, comprising:
an electrical load; and
a circuit, comprising:
a shunt resistor coupled between an input node and a load node, the input node configured to have an input signal applied thereto, the load node configured to be coupled to the electrical load, wherein a voltage drop across the shunt resistor is indicative of a load current supplied to the electrical load,
a replica resistor replicating the shunt resistor, the replica resistor having a first end and a second end,
gain circuitry configured to produce an output signal that is a function of the voltage drop between a first sensing node and a second sensing node,
a current generator configured to generate a reference current,
a set of electronic switches configured to be switched in:
a first mode, wherein the replica resistor is coupled between the first sensing node and the second sensing node of the gain circuitry, and coupled to the current generator to be traversed by the reference current, alternately, in a first direction and a second direction opposite the first direction, wherein the output signal from the gain circuitry assumes a first value in response to the reference current traversing the replica resistor in the first direction and a second value in response to the reference current traversing the replica resistor in the second direction, and a second mode, wherein the shunt resistor is coupled between the first sensing node and the second sensing node of the gain circuitry, and the output signal from the gain circuitry assumes a third value, and calibration circuitry configured to receive the output signal from the gain circuitry and to produce a compensated output signal as a function of the first value, the second value, and the third value, wherein the compensated output signal is indicative of the load current supplied to the electrical load.

13. The device of claim 12, wherein the replica resistor and the shunt resistor exhibit substantially equal relative variations of their resistance values.

14. The device of claim 12, wherein the circuit further comprises:

first switching circuitry configured, when conductive, to couple the shunt resistor between the first sensing node and the second sensing node;

second switching circuitry configured, when conductive, to couple the replica resistor between the first sensing node and the second sensing node;

third switching circuitry configured, when conductive, to couple the first end and the second end of the replica resistor to the input node and to the current generator, respectively, wherein the replica resistor is traversed by the reference current flowing therethrough in the first direction; and fourth switching circuitry configured, when conductive, to couple the second end and the first end of the replica resistor to the input node and to the current generator, respectively, wherein the replica resistor is traversed by the reference current flowing therethrough in the second direction, opposite the first direction; and switching control circuitry configured to control the first, second, third and fourth switching circuitry:

in the first mode, wherein the second switching circuitry is made conductive to couple the replica resistor between the first sensing node and the second sensing node of the gain circuitry, and the third switching circuitry and the fourth switching circuitry are alternately made conductive, wherein the output signal from the gain circuitry assumes the first value in response to the third switching circuitry being made conductive and the second value in response to the fourth switching circuitry being made conductive, respectively, and in the second mode, wherein the first switching circuitry is made conductive to couple the shunt resistor between the first sensing node and the second sensing node of the gain circuitry, and the output signal from the gain circuitry assumes the third value.

15. The device of claim 14, wherein:

the first switching circuitry comprises a first pair of electronic switches configured, when conductive, to couple opposite ends of the shunt resistor to the first sensing node and the second sensing node of the gain circuitry; and the second switching circuitry comprises a second pair of electronic switches configured, when conductive, to couple the first end and the second end of the replica resistor to the first sensing node and the second sensing node of the gain circuitry.

16. The device of claim 15, wherein:

the third switching circuitry comprises a respective pair of electronic switches configured, when conductive, to couple the first end and the second end of the replica resistor to the input node and to the current generator, respectively; and the fourth switching circuitry comprises a further respective pair of electronic switches configured, when conductive, to couple the second end and the first end of the replica resistor to the input node and to the current generator, respectively.

17. A method, comprising:

applying an input signal to an input node, a shunt resistor coupled between the input node and a load node coupled to an electrical load, wherein a voltage drop across the shunt resistor is indicative of a load current supplied to the electrical load;

replicating, by a replica resistor, the shunt resistor, the replica resistor having a first end and a second end;

producing, by a gain circuitry, an output signal that is a function of the voltage drop between a first sensing node and a second sensing node;

generating, by a current generator, a reference current;

switching, a set of electronic switches, in a first mode, wherein the replica resistor is coupled between the first sensing node and the second sensing node of the gain circuitry, and coupled to the current generator to be traversed by the reference current, alternately, in a first direction and a second direction opposite the first direction, wherein the output signal from the gain circuitry assumes a first value in response to the reference current traversing the replica resistor in the first direction and a second value in response to the reference current traversing the replica resistor in the second direction;

switching, the set of electronic switches, in a second mode, wherein the shunt resistor is coupled between the first sensing node and the second sensing node of the gain circuitry, and the output signal from the gain circuitry assumes a third value;

receiving, by a calibration circuitry, the output signal from the gain circuitry;

producing a compensated output signal as a function of the first value, the second value, and the third value; and alternating the set of electronic switches between the first mode and the second mode, wherein, selectively, an occurrence of the first mode takes place at each second mode, or the first mode is repeated after several occurrences of the second mode.

18. The method of claim 17, wherein the replica resistor and the shunt resistor exhibit substantially equal relative variations of their resistance values.

19. The method of claim 17, further comprising:

coupling, a first switching circuitry, when conductive, the shunt resistor between the first sensing node and the second sensing node;

coupling, a second switching circuitry, when conductive, the replica resistor between the first sensing node and the second sensing node;

coupling, a third switching circuitry, when conductive, the first end and the second end of the replica resistor to the input node and to the current generator, respectively, wherein the replica resistor is traversed by the reference current flowing therethrough in the first direction; and coupling, a fourth switching circuitry, when conductive, the second end and the first end of the replica resistor to the input node and to the current generator, respectively, wherein the replica resistor is traversed by the reference current flowing therethrough in the second direction, opposite the first direction, wherein, in the first mode, the second switching circuitry is made conductive to couple the replica resistor between the first sensing node and the second sensing node of the gain circuitry, and the third switching circuitry and the fourth switching circuitry are alternately made conductive, wherein the output signal from the gain circuitry assumes the first value in response to the third switching circuitry being made conductive and the second value in response to the fourth switching circuitry being made conductive, respectively, and wherein, in the second mode, the first switching circuitry is made conductive to couple the shunt resistor between the first sensing node and the second sensing node of the gain circuitry, and the output signal from the gain circuitry assumes the third value.

20. The method of claim 19, further comprising:

coupling, a first pair of electronic switches of the first switching circuitry when conductive, opposite ends of the shunt resistor to the first sensing node and the second sensing node of the gain circuitry; and coupling, a second pair of electronic switches of the second switching circuitry, when conductive, the first end and the second end of the replica resistor to the first sensing node and the second sensing node of the gain circuitry.

* * * * *